(12) United States Patent
Gambino et al.

(10) Patent No.: US 6,194,755 B1
(45) Date of Patent: Feb. 27, 2001

(54) LOW-RESISTANCE SALICIDE FILL FOR TRENCH CAPACITORS

(75) Inventors: Jeffrey P. Gambino, Gaylordsville, CT (US); Ulrike Gruening, Wappingers Falls, NY (US); Jack A. Mandelman, Stormville, NY (US); Carl J. Radens, LaGrangeville, NY (US)

(73) Assignees: International Business Machines Corporation, Armonk, NY (US); Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/102,471

(22) Filed: Jun. 22, 1998

(51) Int. Cl.[7] ................................................. H01L 21/20
(52) U.S. Cl. ........................... 257/301; 438/243; 438/386
(58) Field of Search ..................................... 438/248, 386, 438/430, 427, 398, 397, 396, 300, 255, 254, 253, 245, 244, 243

(56) References Cited

U.S. PATENT DOCUMENTS

| | | |
|---|---|---|
| 4,649,625 | 3/1987 | Lu . |
| 5,336,912 | 8/1994 | Ohtsuki . |
| 5,395,786 * | 3/1995 | Hsu et al. ............................ 438/248 |
| 5,658,816 | 8/1997 | Rajeevakumar . |
| 5,692,281 | 12/1997 | Rajeevakumar . |
| 5,943,581 * | 8/1999 | Lu et al. ............................ 438/386 |

FOREIGN PATENT DOCUMENTS

| | | |
|---|---|---|
| 63-62371 | 3/1988 | (JP) . |
| 64-65862 | 3/1989 | (JP) . |
| 4-287366 | 10/1992 | (JP) . |

OTHER PUBLICATIONS

Process for Trench Planarization, IBM Technical Disclosure Bulletin, vol. 29, No. 3, pp. 1240–1242 (Aug. 1986).
Isolation Merged Stacked Dynamic Random–Access Memory Cell, IBM Technical Disclosure Bulletin, vol. 31, No. 7, pp. 39–42 (Dec. 1988).
Badih El–Kareh, IBM Corporation, Fundamentals of Semiconductor Processing Technologies, Kluwar Academic Publishers, pp. 534–546.

* cited by examiner

Primary Examiner—Mahshid Saadat
Assistant Examiner—José R. Diaz
(74) Attorney, Agent, or Firm—Scully, Scott, Murphy & Presser; Steven Capella, Esq.

(57) ABSTRACT

Trench capacitors are fabricated utilizing a method which results in a refractory metal salicide as a component of the trench electrode in a lower region of the trench. The salicide-containing trench electrode exhibits reduced series resistance compared to conventional trench electrodes of similar dimensions, thereby enabling reduced ground rule memory cell layouts and/or reduced cell access time. The trench capacitors of the invention are especially useful as components of DRAM memory cells.

21 Claims, 4 Drawing Sheets

LOW-RESISTANCE SALICIDE FILL FOR TRENCH CAPACITORS

FIELD OF THE INVENTION

The present invention relates to the manufacture and design of trench capacitors for integrated circuit devices, especially capacitors for use in dynamic random access memory (DRAM) cells and advanced memory devices containing the same.

BACKGROUND OF THE INVENTION

Generally, a semiconductor memory device such as a dynamic random access memory (DRAM) cell comprises a plurality of memory cells which are used to store large quantities of information. Each memory cell typically includes a capacitor for storing electric charge and a field effect transistor (FET) for opening and closing charge and discharge passages of the capacitor. The number of cells (and corresponding bits of memory capacity) of DRAM integrated circuit chips has been increasing by approximately 4×every three years; this has been achieved by reducing memory cell size. Unfortunately, the smaller cell size also results in less area to fabricate the capacitor.

Moreover, as DRAM cell dimensions are scaled down with each successive generation, the cross-sectional area of the deep trench storage capacitor diminishes inversely with the square of the ground rule, while the trench depth has remained approximately constant. This change in trench geometry results in a large increase in the series resistance contributed by the polysilicon electrode contained in the deep trench. The increased resistance in turn may adversely limit the speed at which the corresponding memory cell can be accessed.

One approach to decrease the series resistance of DRAM trench capacitors is to increase the doping concentration of the deep trench polysilicon. This approach however only provides a marginal reduction in series resistance and thus has limited applicability in fabricating DRAM cells of decreased dimension.

Thus, there is a continued need for new manufacturing processes and/or designs which more effectively address the problem of series resistance in the context of trench capacitors and devices incorporating such capacitors (e.g., DRAM chips).

SUMMARY OF THE INVENTION

The present invention provides trench capacitor structures and methods of fabricating trench capacitors wherein the distributed series resistance of the deep trench electrode is substantially reduced for a given trench geometry.

The present invention provides trench capacitor structures and methods of fabricating trench capacitors wherein the series capacitance of the deep trench electrode is substantially increased for a given trench geometry.

A still further object of the present invention is to provide a trench capacitor structure which can be used conventional DRAM and in advanced memory cell devices.

In one aspect, the invention encompasses a process wherein a refractory metal salicide material is formed in a lower trench region of a trench capacitor. The trench is preferably bottle-shaped. The process of the invention preferably comprises:

(a) filling a storage trench in a semiconductor substrate, the trench having a narrow upper region and a broad lower region, with a layer of polysilicon leaving a void in the broad lower region of the trench;

(b) planarizing the structure provided in step (a);

(c) recessing the layer of polysilicon in the narrow upper region of the trench so as to expose the void in the broad lower region of the trench;

(d) forming a conformal refractory metal layer over said bottle-shaped storage trench including in said narrow upper region and said broad lower region;

(e) forming a refractory metal salicide layer in said broad lower region of said trench;

etching said conformal refractory metal layer from said narrow upper region of said trench;

(g) filling said trench with polysilicon; and (h) planarizing the structure provided in step (g).

Step (e) is preferably conducted using a selective reaction which is capable of converting the refractory metal formed in the broad lower region of said trench to a refractory metal salicide having low-resistance.

Another aspect of the present invention relates to a trench capacitor structure having a salicide present in the trench. The capacitor structure of the present invention is preferably useful as a storage capacitor in a DRAM memory cell. The capacitor structure of the invention preferably comprises a storage trench having a narrow upper region and a broad lower region, wherein the broad lower region comprises an outer layer of polysilicon over which is formed a refractory metal salicide layer and a polysilicon inner layer. The storage trench is preferably bottle-shaped.

A further aspect of the present invention is directed to advanced memory cell devices which contain at least the DRAM cell capacitor structure of the present invention therein as one of its components.

These and other aspects of the invention are described in further detail below.

DETAILED DESCRIPTION OF THE INVENTION

Figure 1A:
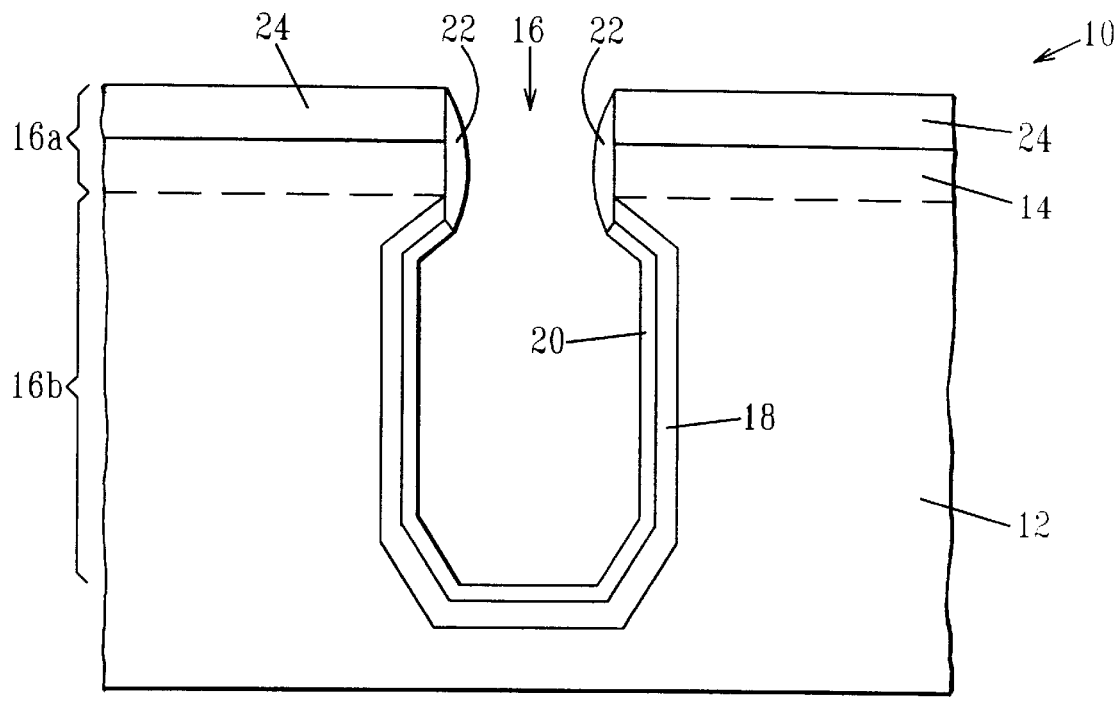
FIGS. 1 (a)–(g) are cross-sectional views of a refractory metal salicide-containing bottle-shaped storage trench capacitor structure which is formed from the processing steps of the present invention.

The present invention will now be described in greater detail by referring to the drawings that accompany this application. It should be understood that the invention is not limited to the specific structures illustrated in the drawings. While the drawings illustrate a bottle-shaped trench, the invention may be practiced using trenches of other shapes and employing alternative void-forming techniques as discussed below. It should also be understood that the invention is not limited to use of any specific dopant type provided that the dopant types selected for the various components are consistent with the intended electrical operation of the device.

FIGS. 1(a)–(g) show various processing steps that may be employed in the present invention for fabricating a DRAM cell capacitor structure of the invention. Specifically, FIG. 1(a) shows a cross-sectional view of an initial bottle-shaped trench structure 10 that is employed in step (a) of the present invention. The bottle-shaped trench structure shown in FIG.

1(a) comprises a semiconductor substrate 12 preferably having a lightly doped epitaxial region 14 and one or more pad dielectric layers 24. The pad dielectric layer (typically a silicon nitride) acts as a protective layer during the etching process used to form trench 16. Trench 16 preferably has a narrow upper region 16a and a broad lower region 16b. In some instances, it may be desirable to form a thin oxide layer (not shown) between semiconductor substrate 12 and pad dielectric 24.

Semiconductor substrate 12 may be formed from any conventional semiconducting material including, but not limited to: Si, Ge, GaP, InAs, InP, SiGe, GaAs or other III/V compounds. Of these semiconducting materials, it is highly preferred that semiconductor substrate 12 be composed of Si.

At broad lower trench region 16b, there is shown a buried plate out-diffused region 18 and node dielectric layer 20. Narrow upper region 16a preferably contains an oxide collar 22 which may be formed by local oxidation of silicon (LOCOS) or other technique.

The initial bottle-shaped structure shown in FIG. 1(a) is fabricated using conventional techniques that are well known to those skilled in the art. For example, the bottle-shaped structure of FIG. 1(a) can be fabricated using the processes disclosed in U.S. Pat. Nos. 4,649,625 to Lu; U.S. Pat. No. 5,658,816 to Rajeevakumar; and U.S. Pat. No. 5,692,281 to Rajeevakumar, the contents of each are being incorporated herein by reference. The buried plate may be formed by any conventional technique of diffusing the appropriate conductivity type dopant through the trench wall. See for example the technique disclosed in U.S. Pat. No. 5,395,786, the disclosure of which is incorporated herein by reference.

In accordance with the present invention, the structure shown in FIG. 1(a), particularly narrow upper trench region 16a and broad lower trench region 16b, is filled with a layer of polysilicon 26 under deposition conditions that are sufficient to form void 28 in broad lower trench region 16b. The polysilicon layer 26 is then planarized to give the structure shown in FIG. 1(b).

Figure 1B:
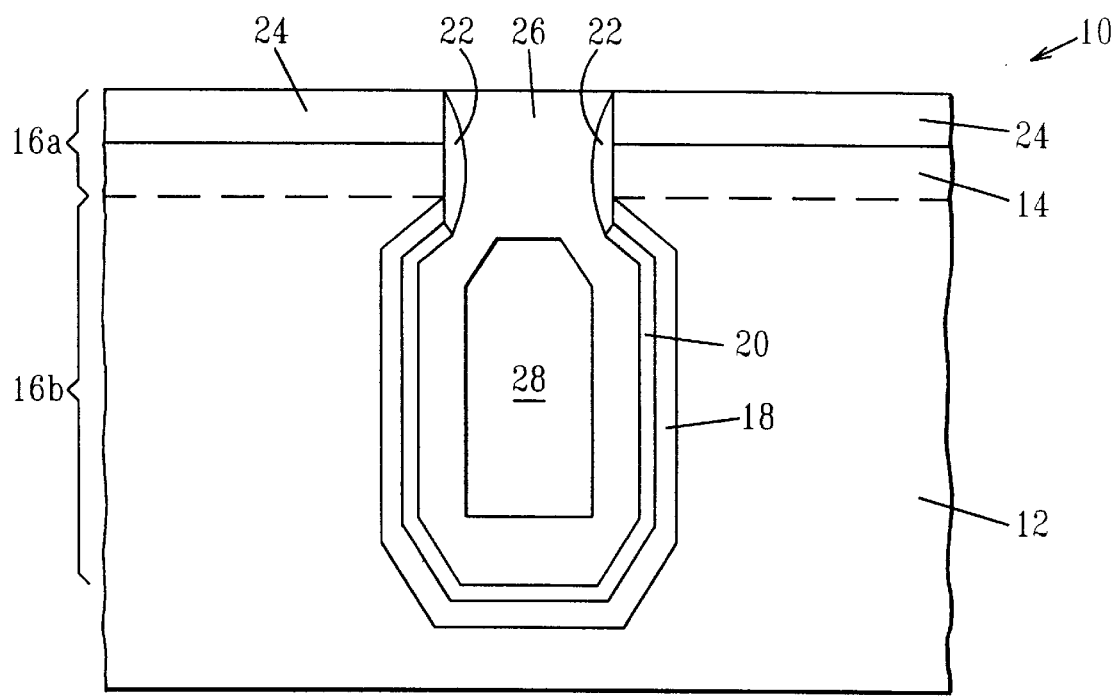

The polysilicon and void which are shown in FIG. 1(b) are formed in the lower trench region of the bottle-shaped trench capacitor structure utilizing conventional deposition techniques such as chemical vapor deposition (CVD) or low pressure chemical vapor deposition (LPCVD). Of these deposition techniques, LPCVD is highly preferred in the present invention for forming polysilicon layer 26 and void 28. The deposition conditions employed in depositing polysilicon layer 26 and forming void 28 may vary depending upon the exact technique used and the trench geometry. In most instances, the deposition conditions used would be those conventionally used for polysilicon fill.

The void would result from the closing off of narrow region 16a by polysilicon deposition on the trench wall. If the deposition conditions selected do not result in formation of the desired void, a void may be formed or expanded using an etching technique as described in U.S. Pat. No. 5,692,281 after the polysilicon planarization.

The polysilicon may be planarized utilizing conventional planarization techniques. For example, the planarization process may be carried out utilizing chemical mechanical polishing (CMP) or etching.

Figure 1C:
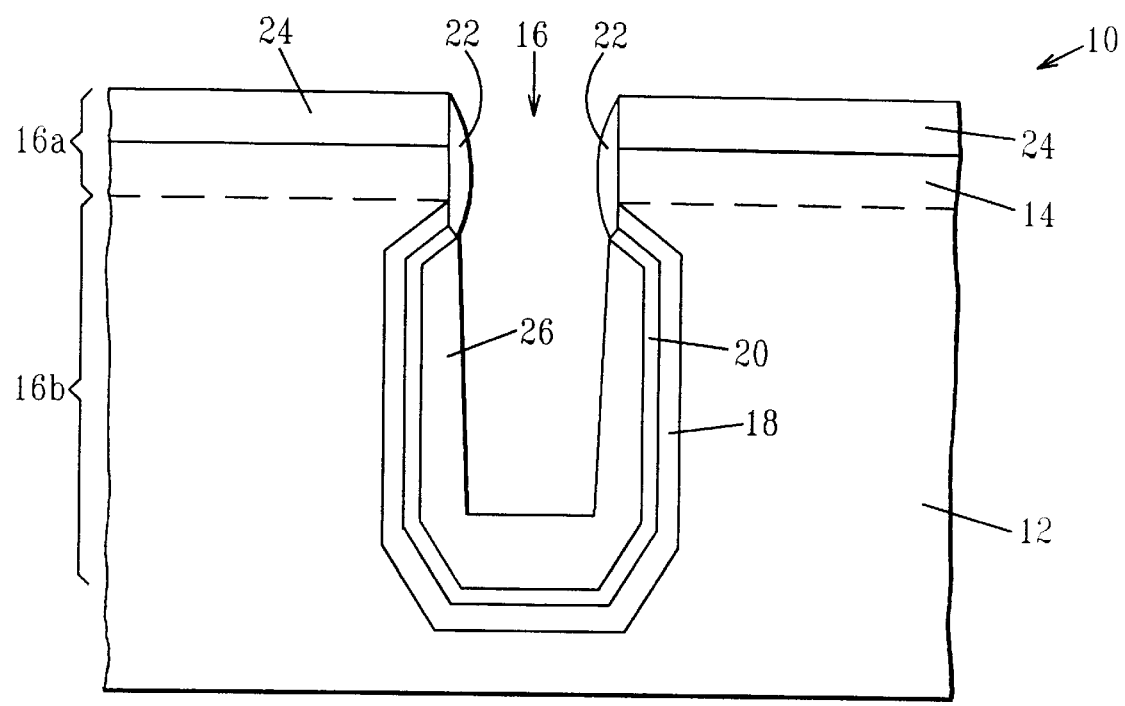

After planarization, the polysilicon fill 26 is preferably recessed as shown in FIG. 1(c) whereby polysilicon layer 26 in the narrow upper trench region 16a is selectively removed to expose void 28 in the broad lower region 16b. The recessing step may be carried out utilizing any conventional anisotropy or isotropic etching process. Alternatively, a combination of anisotropy and isotropic etching techniques may be used to recess polysilicon 26. Examples of suitable etching techniques include ion enhanced etching, ion induced etching, plasma etching, reactive ion etching, reactive ion-beam etching, microwave plasma etching, chemical etching or other like etching techniques. The recessing is preferably performed by a plasma etching process utilizing a halogen such as chlorine or fluorine as the reactive plasma gas. Assuming the previously formed void 28 is of a sufficient size, the recessing process employed preferably does not substantially remove polysilicon from the broad lower region 16b of the trench. As noted above, it may be desired to form or increase the void size as part of or subsequent to the recessing step.

Figure 1D:
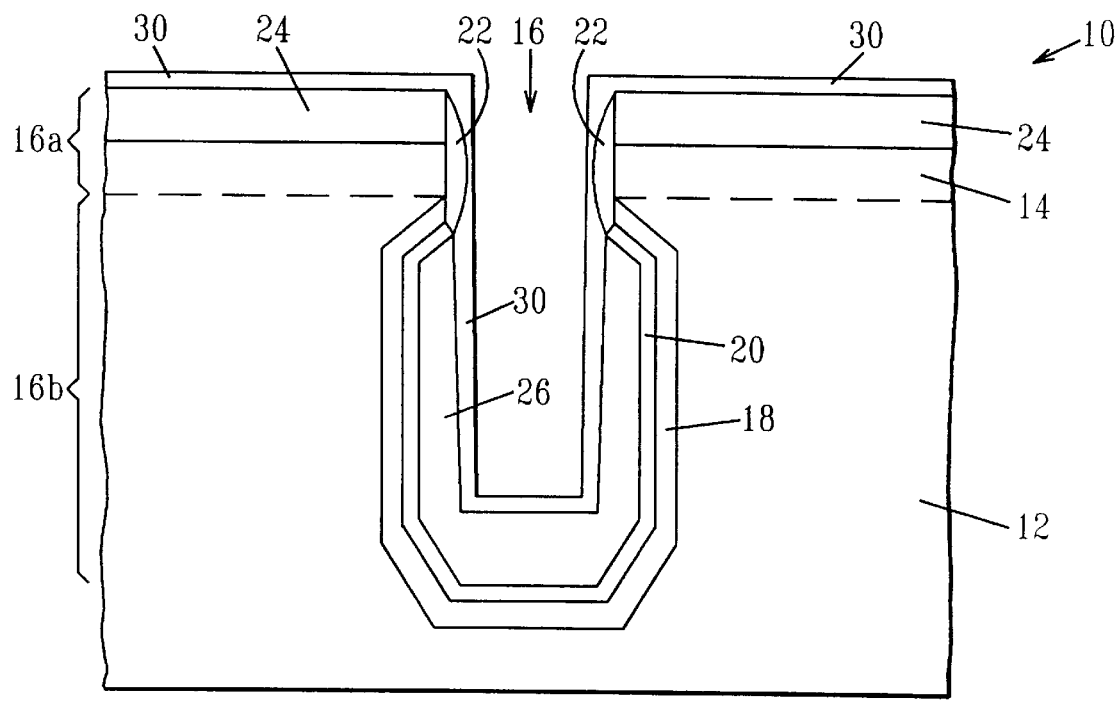

After the recessing, a conformal refractory metal layer 30 is deposited as shown in FIG. 1(d). The refractory metal layer may be formed utilizing any conventional deposition process which is capable of forming a conformal layer. Examples of suitable deposition techniques are CVD, sputtering, electroplating, electroless-plating or other like deposition processes. The refractory metal layer 30 is preferably formed by CVD.

Various refractory metals may be used to form layer 30. Examples of suitable refractory metals are Ti, Ta, W, Co, Mo or other like refractory metals that are capable of forming a metal salicide when annealed in the presence of a silicon-containing material. Thus, for example, if a layer of Ti is formed, the annealing conditions discussed below are capable of converting Ti to $TiSi_x$ (preferably $TiSi_2$).

Figure 1E:
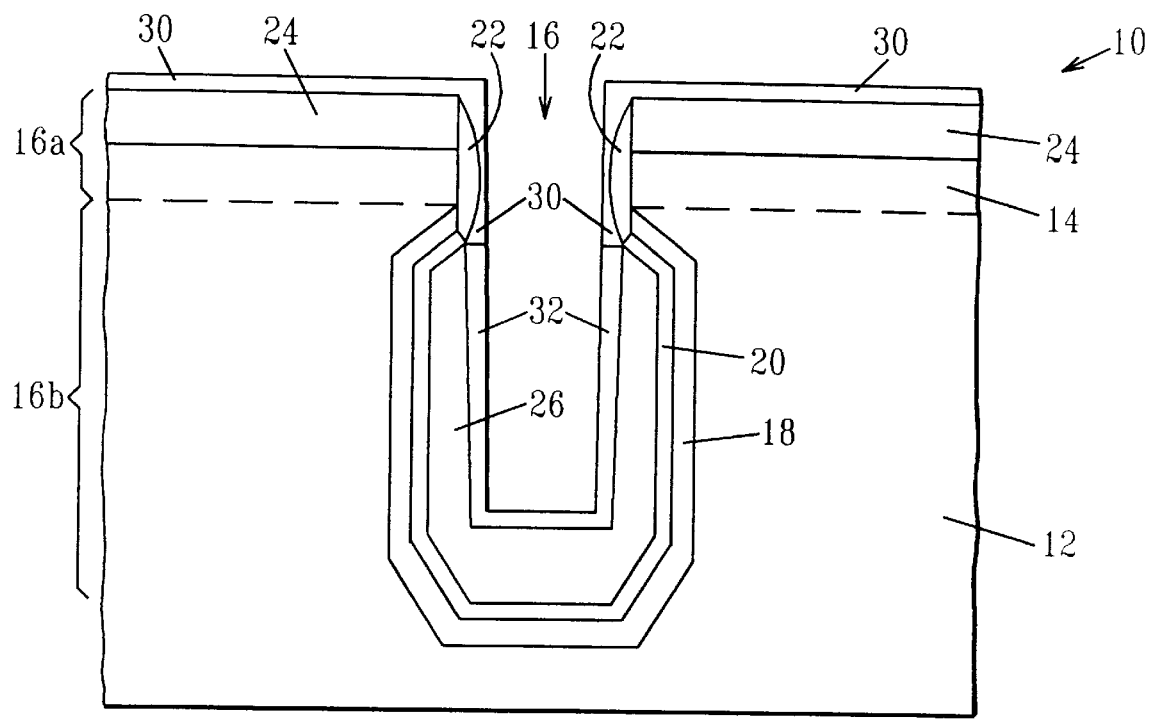

After deposition of refractory metal layer 30, a refractory metal salicide layer 32 is formed in broad lower trench region 16b as illustrated in FIG. 1(e) by annealing which causes salicide formation at the refractory metal—polysilicon interface in region 16b. It is highly preferred that no refractory metal salicide is formed in the narrow upper trench region 16a. Formation of salicide region 16a is prevented by the collar oxide 22 and by removal of polysilicon from region 16a during the recessing step.

The annealing step employed in the present invention is preferably conducted in the presence of a non-oxidizing ambient such as helium, nitrogen, argon or mixtures thereof. The annealing step may be carried out at atmospheric pressure or under a suitable vacuum. The annealing is preferably carried out at a temperature of about 600° to 1000° C. for a time period of about 5 seconds to 1 hour. Shorter annealing times are typically employed with higher annealing temperatures, whereas longer annealing times are typically employed with lower annealing temperatures. More preferably, the annealing step is carried out at a temperature of about 700° to 800° C. for a time period of about 10 seconds to 60 seconds. The annealing step can be carried out at a set temperature or it can be ramped up to a desired temperature utilizing various ramp and soak cycles.

The refractory metal salicide formed by the annealing step of the present invention preferably has a measured resistivity of about 15 to 150 μohm-cm. More preferably, the resistivity of the refractory metal salicide formed in the annealing step is about 15 to 25 μohm-cm.

Figure 1F:
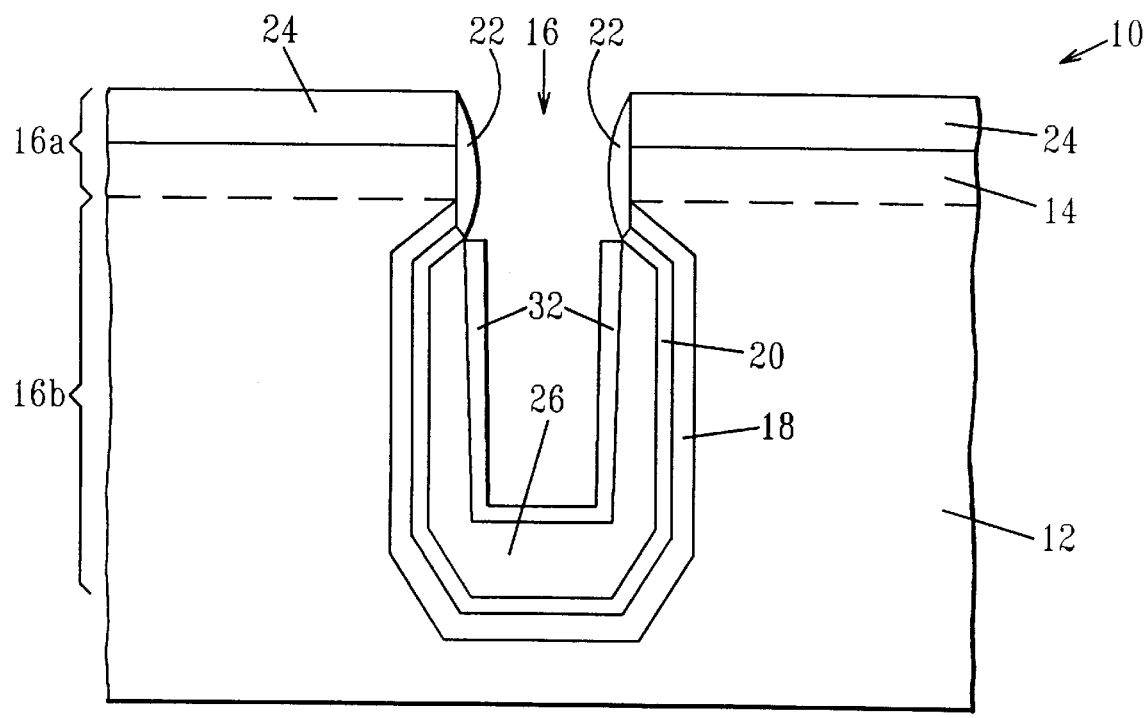
Figure 1G:
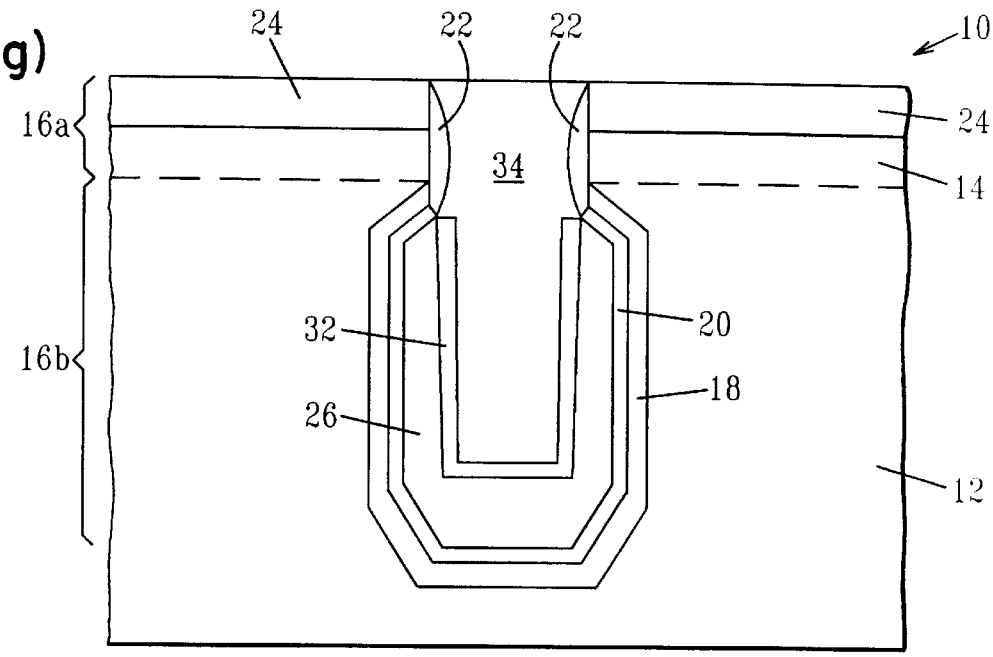

After formation of the desired refractory metal salicide layer 32 in the broad lower region 16b of the trench structure, the remaining refractory metal layer 30 in upper region 16a is removed. The resulting structure is illustrated in FIG. 1(f). Preferably, a chemical wet etch process that is highly selective in etching refractory metal is used to remove remaining layer 30. Any chemical etchant that is capable of removing the refractory metal from the upper trench region of the capacitor structure can be employed in the present invention. Illustrative examples of suitable chemical etchants are $H_2O_2$, HCl, $HNO_3$, acetic acid, chromic acid, phosphoric acid, sulfuric acid, ammonium hydroxide or other like chemical etchants. Mixtures of these chemical etchants with each other or with water may also be used. $H_2O_2$ is a preferred chemical etchant.

After removal of the refractory metal 30 from the upper region 16a of the trench structure, the trench is then filled with additional polysilicon 34 utilizing any of the above mentioned deposition processes used in forming polysilicon layer 26. The capacitor structure is then planarized using any of the above planarization techniques or plasma etching to give the capacitor structure shown in FIG. 1(g).

The capacitor structure of the invention containing refractory salicide layer 32 in the broad lower region of the trench has substantially reduced series resistance than comparable structures that do not contain such a metal salicide layer therein. Typically, the present invention is capable of reducing the series resistance caused by the deep trench polysilicon as much as 100×for a given trench geometry/ground rule. Alternatively, the invention may be used to create capacitor structures with even smaller ground rule which have series resistance similar to wider capacitor structures.

Figure 2:
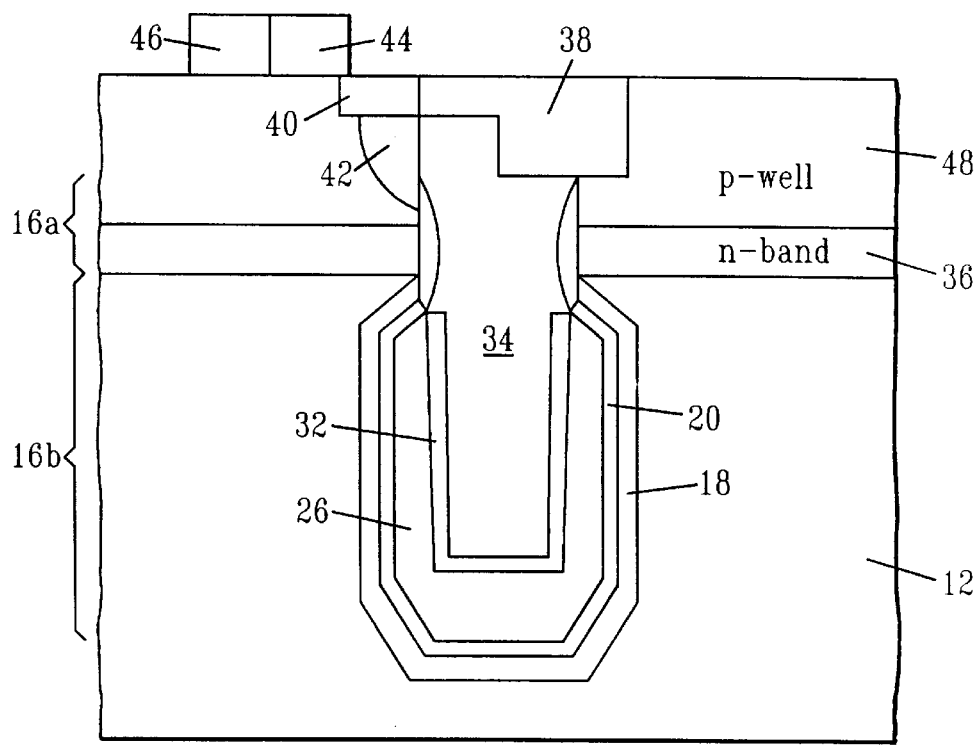
FIG. 2 is a cross-sectional view of an advanced memory cell device which can be fabricated from the capacitor structure shown in FIG. 1(g).

The capacitor structures of the invention may be used in DRAM memory cells such as the one shown in FIG. 2 or in other integrated circuit devices. Specifically, memory cell in FIG. 2 comprises the capacitor structure shown in FIG. 1(g) as well as n-band region 36, p-well 48, shallow trench isolation region 38, buried strap region 42, array implant region 40, gate conductor region 44 and array conductor region 46.

The memory cell device shown in FIG. 2 may be fabricated utilizing the method of the present invention in combination with other manufacturing steps to form shallow trench isolation, gate conductor regions and other memory cell components, which other manufacturing steps are well known to those skilled in the art. The formation of n-band regions is discussed in European Published Patent Application 822599, published Feb. 4, 1998, the disclosure of which is incorporated herein by reference. Examples of those manufacturing steps are disclosed in the above mentioned patent documents and/or are otherwise known to those skilled in the art.

In addition to memory cells and the manufacture thereof, the capacitor structures and manufacturing techniques of the invention may also be useful in conjunction with other integrated device structures and device manufacturing techniques.

While the invention has been particularly shown and described with respect to preferred embodiments thereof, it will be understood by those skilled in the art that the foregoing and other changes in form and details may be made therein without departing from the spirit and scope of the present invention.

What is claimed is:

1. A method of fabricating a trench capacitor structure in a semiconductor substrate, said method comprising:
   (a) providing a semiconductor substrate having (i) a trench therein, said trench having a narrow upper region and a broad lower region, (ii) an electrode in said substrate about said broad lower region, and (iii) a conformal node dielectric lining said electrode;
   (b) filling said trench with a layer of polysilicon leaving a void in said broad lower region of said trench;
   (c) planarizing any polysilicon formed outside said trench stopping on said semiconductor substrate;
   (d) removing the layer of polysilicon in said narrow region of said trench, said void in said broad lower region of said trench being exposed;
   (e) forming a conformal refractory metal layer in said narrow upper region and said broad lower region of said trench;
   (f) annealing said refractory metal layer so as to form a refractory metal silicide layer in said broad lower region on said trench;
   (g) removing any remaining conformal refractory metal layer not silicided by step (f) from said narrow upper region of said trench;
   (h) filling said trench with polysilicon; and
   (i) planarizing any polysilicon formed outside said trench stopping on said semiconductor substrate so as to form a trench capacitor structure having reduced distributed series resistance.

2. The method of claim 1 wherein said semiconductor substrate is Si.

3. The method of claim 1 wherein said electrode is an out-diffused buried plate.

4. The method of claim 1 wherein a collar oxide is provided about the upper region of said trench prior to step (b).

5. The method of claim 1 wherein step (b) is carried out by low pressure chemical vapor deposition.

6. The method of claim 5 wherein said void is completely covered by said polysilicon deposited in step (b).

7. The method of claim 1 wherein step (c) is carried out by chemical mechanical polishing or etching.

8. The method of claim 1 wherein said removal step (d) comprises etching said polysilicon by anisotropy etching, isotropic etching or a combination thereof.

9. The method of claim 8 wherein said etching is performed by ion enhanced etching, ion induced etching, plasma etching, reactive ion etching, reactive ion-beam etching or microwave plasma etching.

10. The method of claim 1 wherein step (d) is carried out by plasma etching utilizing a halogen as a reactive plasma gas.

11. The method of claim 1 wherein said polysilicon is completely removed from said narrow upper region in step (d).

12. The method of claim 1 wherein step (e) is carried out by chemical vapor deposition, sputtering, electroplating or electroless-plating.

13. The method of claim 12 wherein step (e) is carried out by chemical vapor deposition.

14. The method of claim 1 wherein said refractory metal is selected from the group consisting of Ta, W, Co, Ti and Mo.

15. The method of claim 1 wherein said annealing is conducted in the presence of a non-oxidizing atmosphere.

16. The method of claim 15 wherein said annealing is carried out at a temperature of about 600° to 1000° C. for about 5 seconds to 1 hour.

17. The method of claim 16 wherein said annealing is carried out at a temperature of about 700° to 800° C. for about 10 to 60 seconds.

18. The method of claim 1 wherein said refractory metal salicide has a resistivity of about 15 to 150 $\mu$ohm-cm.

19. The method of claim 18 wherein said refractory metal salicide has a resistivity of about 15 to 25 $\mu$ohm-cm.

20. The method of claim 1 wherein said refractory metal is removed in step (g) by wet chemical etching with a chemical etchant selected from the group consisting of $H_2O_2$, HCl, $HNO_3$, acetic acid, chromic acid, phosphoric acid, sulfuric acid, ammonium hydroxide and mixtures thereof.

21. The method of claim 20 wherein said chemical etchant is $H_2O_2$.